(12) United States Patent
Frame et al.

(10) Patent No.: US 6,856,158 B2
(45) Date of Patent: Feb. 15, 2005

(54) COMPARATOR CIRCUIT FOR SEMICONDUCTOR TEST SYSTEM

(75) Inventors: James W. Frame, Highland Park, IL (US); Richard W. Chrusciel, Belmont, MA (US)

(73) Assignee: Advantest Corp., Tokyo (JP)

( * ) Notice: Subject to any disclaimer, the term of this patent is extended or adjusted under 35 U.S.C. 154(b) by 444 days.

(21) Appl. No.: 10/136,506

(22) Filed: May 1, 2002

(65) Prior Publication Data

US 2003/0208711 A1 Nov. 6, 2003

(51) Int. Cl.[7] .......................... G01R 31/28; H03K 5/22
(52) U.S. Cl. ........................................ 324/765; 327/65
(58) Field of Search .................. 324/765, 754, 324/769, 158.1; 327/63, 65; 714/724, 736

(56) References Cited

U.S. PATENT DOCUMENTS

| | | |
|---|---|---|
| 5,898,326 A | 4/1999 | Okayasu |
| 6,016,566 A | 1/2000 | Yoshida |
| 6,300,804 B1 * | 10/2001 | Vadipour .................... 327/63 |
| 6,323,694 B1 * | 11/2001 | Creek ........................ 327/69 |
| 6,392,448 B1 * | 5/2002 | Vadipour .................... 327/51 |

OTHER PUBLICATIONS

Oshima et al, Pin Electronics IC for High Speed Differential Devices, ITC International Test Conference, pp. 1128–1133, (month unavailable) 2001.

* cited by examiner

Primary Examiner—Ernest Karlsen
(74) Attorney, Agent, or Firm—Muramatsu & Associates

(57) ABSTRACT

A comparator circuit for use in a semiconductor test system for comparing differential output signals of a semiconductor device under test (DUT). The comparator circuit is formed of a first pair of comparators having a DC comparator and an AC comparator which receives a first differential signal, a second pair of comparators having a DC comparator and an AC comparator which receives a second differential signal, a first latch for latching output of the first pair of comparators, a second latch for latching output of the second pair of comparators, and first and second serial-parallel converters for converting output signals of the first and second latches into parallel signals. The comparator circuit is formed of discrete components on a dielectric substrate.

12 Claims, 8 Drawing Sheets

COMPARATOR CIRCUIT FOR SEMICONDUCTOR TEST SYSTEM

FIELD OF THE INVENTION

This invention relates to a comparator circuit for use in a semiconductor test system for comparing output signals of a semiconductor device under test (DUT), and more particularly, to a comparator circuit for high speed differential output signals of DUT and having a low cost circuit configuration without requiring an exclusive LSI comparator circuit.

BACKGROUND OF THE INVENTION

In testing semiconductor devices such as ICs and LSIs by a semiconductor test system, a semiconductor device to be tested is placed on a test head and is provided with test signals (test patterns) produced by a pattern generator in the semiconductor test system at its appropriate test pins at predetermined test timings. The semiconductor device under test produces output signals in response to the test signals which are received by the semiconductor test system. The output signals are strobed (sampled) by strobe signals at predetermined timings and are compared with expected output data to determine whether the semiconductor device functions correctly or not.

An example of the structure and operation of the semiconductor test system will be briefly explained with reference to FIG. 1. In the example of FIG. 1, a test processor 11 is a dedicated processor provided within the semiconductor test system for controlling the operation of the test system through a tester bus. Based on pattern data from the test processor 11, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13, and the test pattern is supplied to a device under test (DUT) 19 through a pin electronics 20 and a test fixture 22.

An output signal of the DUT 19 is converted to a logic signal by an analog comparator 16 with reference to a predetermined threshold voltage levels. The logic signal is compared with expected value data from the pattern generator 12 by a logic (pattern) comparator 17. The result of the logic comparison is stored in a failure memory 18 to be used later in a failure analysis stage.

A pair of driver 15 and analog comparator 16 is configured in a manner shown in the pin electronics 20 for each test pin (tester channel) and is switched by switches (not shown) depending on whether the corresponding device pin is input or output. A large scale semiconductor test system has a large number of test pins, such as more than 256 test pins. Thus, in an actual test system, the pin electronics 20 includes a large number of such driver and comparator pairs as well as switches. The test fixture 22 is a mechanical block containing a large number of connectors such as pogo-pins, cables, and a board to interface between the pin electronics 20 and the DUT 19.

There is a type of semiconductor device which has two output terminals for producing differential output signals such as an ECL (Emitter Coupled Logic) device and an LVDS (Low Voltage Differential Signaling) device. Because the operation speed is very high, such as 3 GHz (gigahertz) or higher, these devices play an important role in an image processing, a video device, 3D graphic technology where large volume of data has to be transferred. Other example having a differential output is a serial communication device such as a serializer and a deserializer. A signal level (voltage swing) of these differential devices is small, thereby being susceptible to noise such as common mode voltage fluctuations. The present invention is directed to a comparator circuit for use in a semiconductor test system for testing differential output signals (balanced transmission signals) of such high speed differential devices.

In testing differential output signals of DUT, it is tested whether each of the output signals is proper or not as well as whether the differential output signals as a whole are proper or not. FIG. 2A shows an example of circuit configuration of a comparator circuit 36 in the conventional technology for one test channel of a semiconductor test system. The comparator circuit 36 compares differential output signals, i.e., balanced transmission signals from a DUT 19 by comparators 41 and 42 separately provided from one another, upon receiving the differential output signals 31 and 32, respectively from the DUT 19.

In this circuit configuration, the low/high evaluation of the DUT differential output signals is made through comparison with predetermined reference voltages V1 and V2 given to the corresponding comparators 41 and 42. The reference voltages V1 and V2 are variable voltages for defining threshold voltages of the comparators. Strobe signals are provided to the comparators to define the comparison timings by the comparators 41 and 42.

FIG. 2B shows an example of waveforms in the differential output signals 31 and 32. This example is introduced here for explaining the problem involved in the comparator circuit 36. When a common mode peak is generated by the effect such as noise or other causes, a peak will be detected as an abnormal signal at the output of one of the comparators when the peak exceeds the threshold voltage.

When this kind of DUT output waveform is generated, DUT is judged as defective in the single output test wherein only one of the output signals is evaluated. However, under the differential output situation, such a common mode noise is sometimes considered non-defective in a practical use. Thus, it is necessary to test the differential output signals with a more precise and detailed manner. However, in the conventional test method, the differential output test is difficult to perform, and DUTs are frequently determined as defective even though the DUTs should be acceptable.

To more completely test the differential output devices, a differential IC chip has been proposed in which one testing channel is comprised of a differential driver and a differential comparator (2001 ITC International Test Conference, pp 1128–1133). FIG. 3A shows a block diagram of such a differential comparator incorporated in the differential IC chip. The differential comparator consists of two single-ended comparators 45 and 46, one differential comparator 48, and a selector block 49. Control signals (Psel Nsel, Dsel) are used for selecting the desired comparator results.

ACHI and BCLO are the comparison results sent to the logic comparator in the test semiconductor system. ACHI output is used for checking the DUT output signal is "High" state, and BCLO is used for checking the DUT output signal is "Low" state. The single ended comparators 45 and 46 are used for positive and negative DUT output signals, respectively. The differential comparator 48 is used to compare the differential swing of the DUT outputs.

The differential IC chip of FIG. 3A will be effective when it is incorporated in the pin electronics of the semiconductor test system at an early stage of production of the test system. However, it is expensive to produce such custom IC chips through a semiconductor production process and requires a long turn around time before actual IC chips are produced. Further, there arise a case where a user wants to test a differential device by a test system existing in his laboratory where the test system is not provided with differential comparators. For replacing the overall pin electronics with a pin electronics block configured by the differential IC chips noted above, a large scale change is involved, which requires a user to pay a large amount of money. Moreover, the replacement of the overall pin electronics has to change the performance of the existing test system which requires a complete change in the test program and may produce test results inconsistent to the previous test results.

FIG. 3B shows an example of waveforms of differential output signals for explaining a further disadvantage of the differential IC chip of FIG. 3A. In this example, the common mode voltage of the differential output signals DUT-P and DUT-N changes at a time t from Vc1 to Vc2. Such a short term common voltage changes cannot be effectively detected by the comparator circuit of FIG. 3A. This is because the comparator 48 is configured by a preamplifier which is a DC differential amplifier. Since a differential amplifier detects the voltage difference between the two inputs, such a voltage shift in the common mode voltage from Vc1 to Vc2 cannot be detected because the voltage difference between the two signals is unchanged.

As has been described above, the differential comparators in the conventional technology are not suitable for accurately testing differential output signals of high speed and small voltage swing. The differential IC chip recently proposed as shown in FIG. 3A requires to produce a customer IC which is expensive and takes too long a time from a design stage to an actual production. It is also difficult to replace the circuit components in the existing test systems used by customers with new differential IC chips. Therefore, there is a need in the industry for new differential comparator with high speed performance, low cost and easy installation in the existing test system.

SUMMARY OF THE INVENTION

It is therefore an object of the present invention to provide a differential comparator circuit which is relatively easily installed in a semiconductor test system existing in a market at low cost.

It is another object of the present invention to provide a differential comparator circuit formed with discrete semiconductor components, rather than an IC chip, for comparing and detecting differential signals from a device under test.

It is a further object of the present invention to provide an active card having at least a differential comparator circuit which is mounted in a test fixture of a semiconductor test system.

It is a further object of the present invention to provide an active card having a differential comparator circuit which provides comparison results to a pin electronics of a semiconductor test system and receives control signals from the pin electronics.

It is a further object of the present invention to provide a differential comparator circuit for differential output signals which is not affected by a common mode noise and is able to detect a short term change in the common mode voltage.

The comparator circuit of the present invention is designed for use in a semiconductor test system for comparing differential output signals of a semiconductor device under test (DUT). The comparator circuit is formed of a first pair of comparators having a DC comparator and an AC comparator which receives a first differential signal, a second pair of comparators having a DC comparator and an AC comparator which receives a second differential signal, a first latch for latching output of the first pair of comparators, a second latch for latching output of the second pair of comparators, and first and second serial-parallel converters for converting output signals of the first and second latches into parallel signals.

Another aspect of the present invention is an active card having at least a differential comparator circuit noted above. The active card is comprised of a differential comparator circuit for comparing differential signals that are output from the DUT, and a dielectric substrate for mounting discrete components on a surface thereof for establishing the differential comparator circuit. The active card having the differential comparator circuit is mounted in a test fixture of the semiconductor test system where the test fixture is located between the DUT and a pin electronics of the semiconductor test system for establishing electrical connection therebetween.

According to the present invention, the differential comparator circuit can be easily installed in a semiconductor test system existing in the market at low cost. The differential comparator circuit is formed with discrete semiconductor components, rather than an IC chip, thus, can be produced without an expensive semiconductor design and production process. Further, the differential comparator circuit is designed to detect a short term change in the common mode voltage while not being affected by the common mode voltage change.

In the present invention, an active card having at least a differential comparator circuit is created and is mounted in a test fixture of the semiconductor test system. The active card having the differential comparator circuit provides comparison results to a pin electronics of a semiconductor test system and receives control signals from the pin electronics. Since the test fixture is detachably from a test head of the semiconductor test system, the active card can be easily installed in the semiconductor test system without significantly affecting the preexisting performance of the test system.

DETAILED DESCRIPTION OF THE INVENTION

Figure 3A:
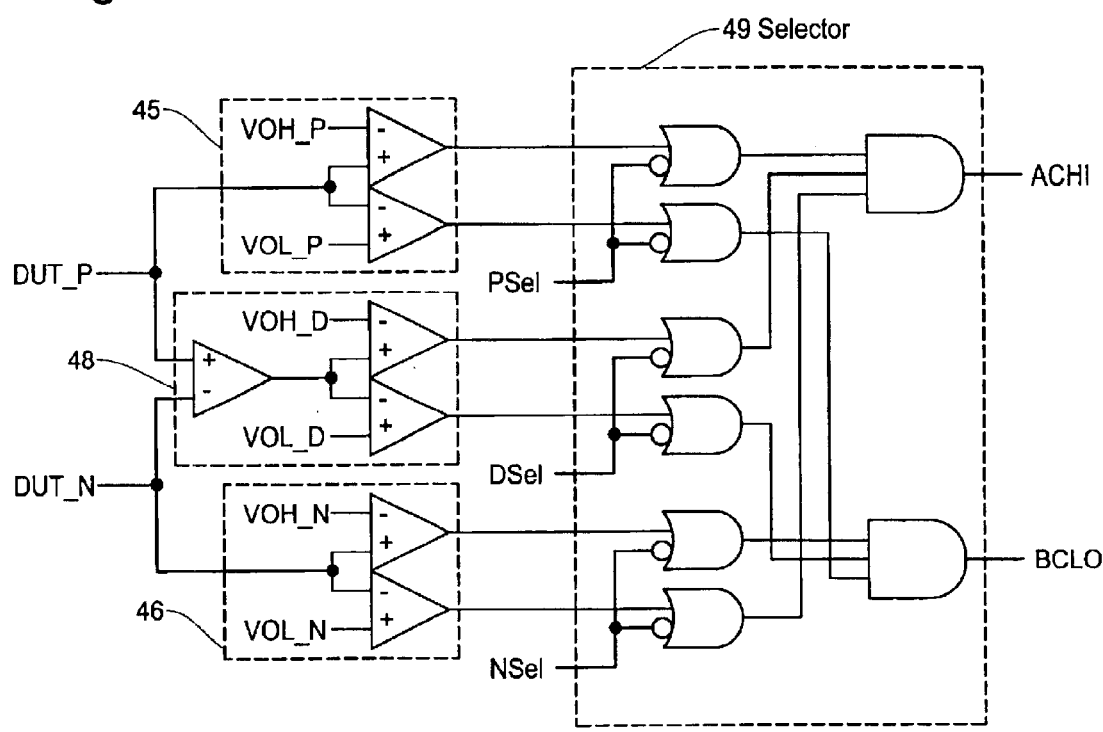
FIG. 3A is a circuit diagram showing a circuit structure of another conventional differential comparator which is established as an IC chip.
Figure 4A:
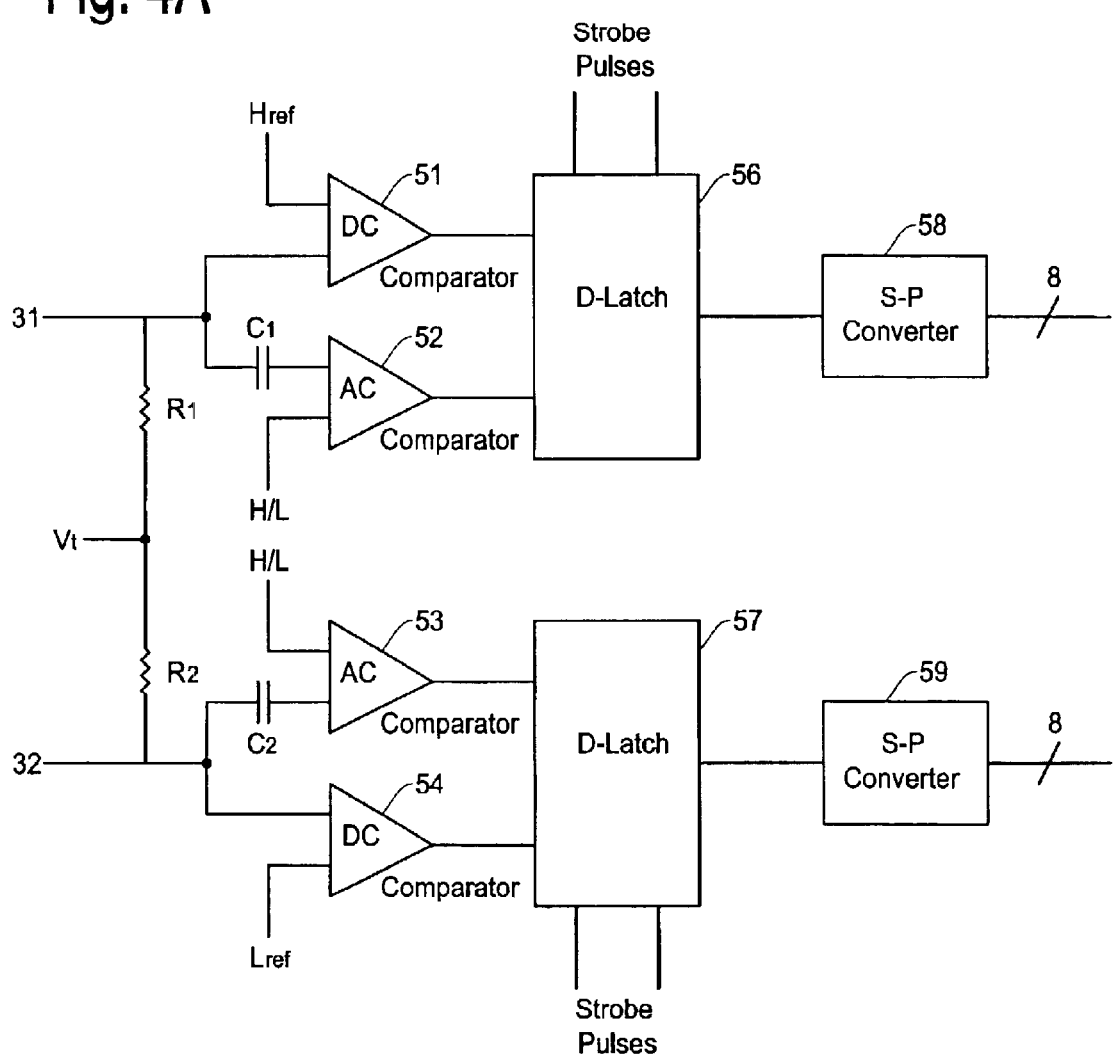
FIG. 4A is a block diagram showing a basic circuit configuration of a differential comparator circuit of the present invention.

The differential comparator of the present invention will be described here with reference to the accompanying drawings. FIG. 4A shows an example of structure in the differential comparator circuit of the present invention. The differential comparator of the present invention is established with use of discrete component available in the market in, for example, a hybrid IC manner. Thus, it is unnecessary to create a customer IC chip as required in the conventional technology of FIG. 3A.

In the example of FIG. 4A, the differential comparator includes comparators 51–54, strobe D-latches 56 and 57, serial-parallel converters 58 and 59, termination resistors R1 and R2, and capacitors C1 and C2. The capacitor C1 is connected to an input terminal of the comparator 52 and the capacitor C2 is connected to an input terminal of the comparator 53. Thus, the comparators 52 and 53 respectively function as AC comparators while the comparators 51 and 54 respectively function as DC comparators. The comparators 51–54 can be established with use of "Comparator Limit Amp GD16511" by Intel.

A differential signal (first differential signal) 31 is provided to the DC comparator 51 and the AC comparator 52 and another differential signal (second differential signal) 32 is provided to the AC comparator 53 and the DC comparator 54. Resistance values of the terminal resistors R1 and R2 are selected to impedance match with signal lines for the differential signals 31 and 32. For example, when the differential impedance of the differential signal lines is 100 ohm, the resistance of each of the terminal resistors R1 ad R2 is 50 ohm.

The D-latches 56 and 57 hold the output of the comparators 51–54 at the timing of strobe signals applied thereto. The D-latch 56 latches the output of the comparator 51 or the output of the comparator 52 by the strove signals and provides the result to the serial-parallel converter 58. The D-latch 57 latches the output of the comparator 53 or the output of the comparator 54 by the strove signals and provides the result to the serial-parallel converter 59. The D-latches 56 and 57 can be established with use of "Strobe D-Latch MC100EP29" by Motorola.

The serial parallel converter 58 converts the output of the D-latch 56 into parallel signals such as eight bits which are sent to the pin electronics 20 of the semiconductor test system. The serial parallel converter 59 converts the output of the D-latch 57 into parallel signals such as eight bits which are sent to the pin electronics 20. Thus, high speed differential outputs of DUT can be processed in a lower speed by the pin electronics 20 and logic comparator 17 (FIG. 1) whose operation speed is lower than that of the DUT. The serial-parallel converters 58 and 59 can be established with use of "Serial/Parallel Converter MC100EP445" by Motorola.

For complete evaluation of the differential output signals of the DUT, the differential comparator of FIG. 4A operates four times. In the first test, the DC comparators 51 and 54 compare the differential outputs of DUT with high threshold voltages. In the second test, the AC comparators 52 and 53 compare the differential outputs of DUT with high threshold voltages. In the third test, the AC comparators 52 and 53 compare the differential outputs of DUT with low threshold voltages. In the fourth test, the DC comparators 51 and 54 compare the differential outputs of DUT with low threshold voltages. Although not shown in FIG. 4A, control signals will be provided through the pin electronics 20 to the differential comparator to carry out the above noted test procedure.

Figure 3B:
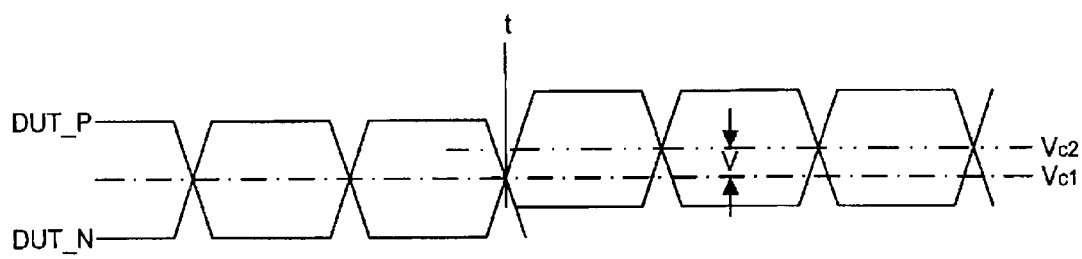
FIG. 3B is a waveform diagram showing a problem involved in the differential comparator circuit of FIG. 3A.

Because the AC comparators 52 and 53 are used in the present invention, in addition to the DC comparators 51 and 54, each AC comparator independently monitors one of the differential output signals. Therefore, a voltage shift in the common mode voltage such as shown in FIG. 3B can be detected by the differential comparator of the present invention. It should be noted that since the conventional differential comparator of FIG. 3A monitors a voltage difference between the two output signals, it is not possible to detect the voltage shift shown in FIG. 3B.

Figure 4B:
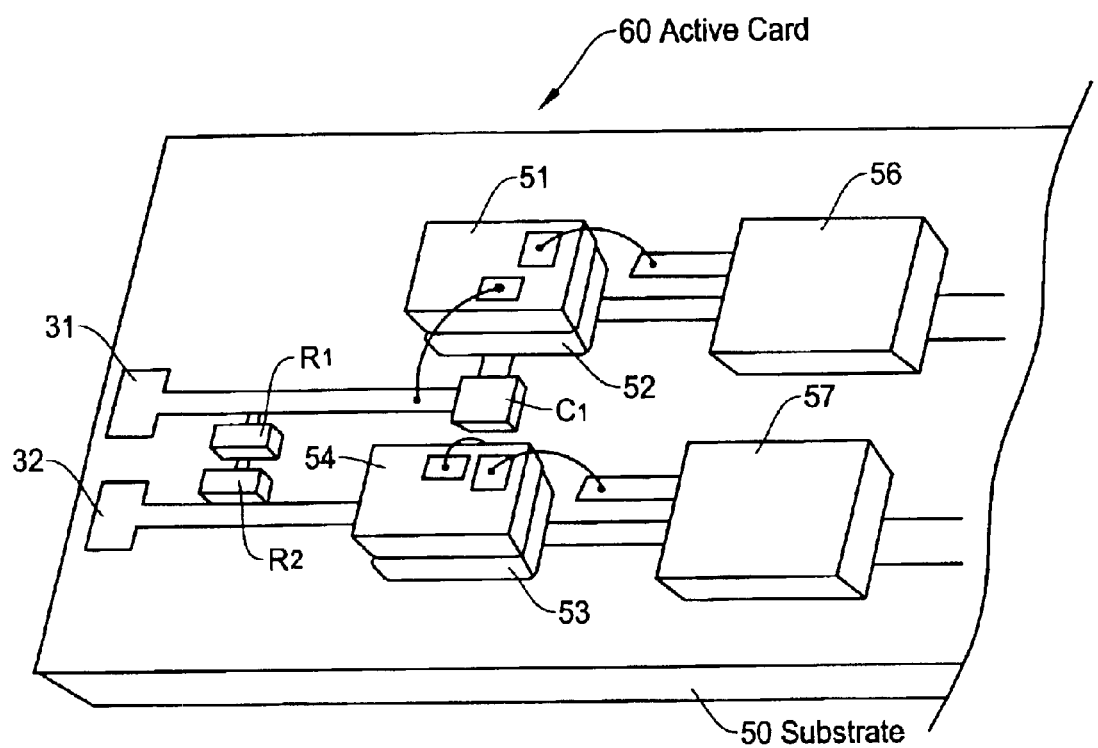
FIG. 4B is a perspective view showing an example of structure in mounting discrete components for establishing the differential comparator circuit of FIG. 4A.

FIG. 4B shows an example of structure in mounting the discrete components used in the differential comparator circuit of the present invention. The discrete components are mounted on a substrate 50 to form an active card 60 which will be installed in the test fixture of the semiconductor test system. The substrate 50 is made, for example, of glass, ceramic, silicon or other dielectric materials. The substrate 50 includes high frequency transmission lines such as microstrip lines with predetermined characteristic impedance for transmission of the associated signals in the active card 60.

The comparators 51–54 are in a packaged form, a bare chip form or the like and mounted on the substrate 50 through, for example, a surface mount technology. In this example, two comparators 51 and 52 are juxtaposed with one another and connected to a signal line such as a microstrip line for the first differential signal 31. Similarly, two comparators 53 and 54 are juxtaposed with one another and connected to a signal line for the second differential signal 32. The DC comparators 51 and 53 are directly connected to the respective signal lines while the AC comparators 52 and 53 are connected to the respective signal lines through the respective capacitors C1 and C2. Resistor chips R1 and R2 are connected between the two signal lines. D-latches 56 and 57 are also mounted on the substrate. Although not shown, the serial-parallel converters 58 and 59 are similarly mounted on the substrate 50.

Figure 5:
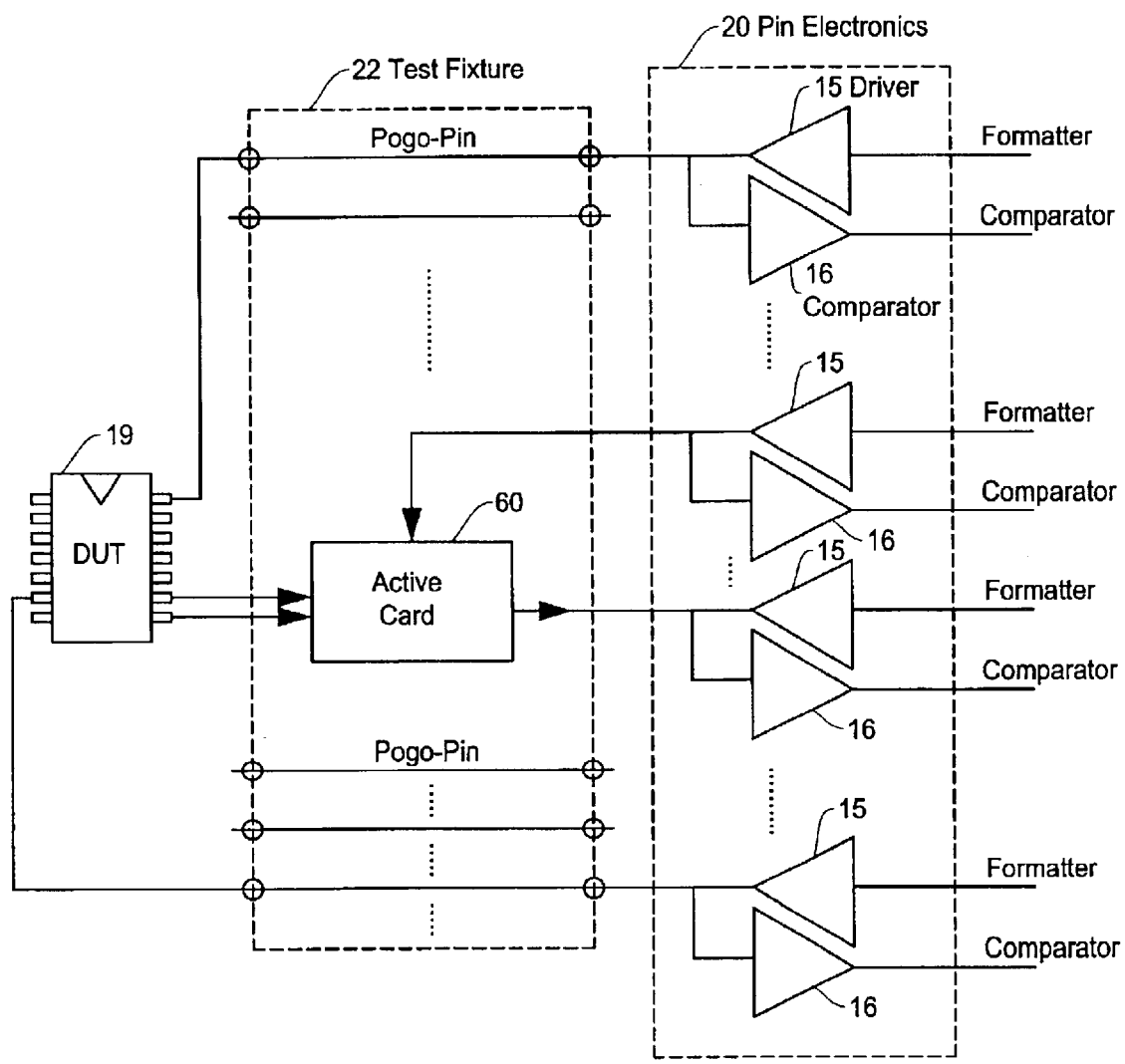
FIG. 5 is a schematic diagram showing a concept of the present invention where an active card having the differential comparator of the present invention is mounted in a test fixture of a semiconductor test system.

FIG. 5 shows a concept of the present invention where an active card 60 having the differential comparator of the present invention is mounted in a test fixture of a semiconductor test system. Generally, a test fixture is a mechanical block which interfaces between the pin electronics of the semiconductor test system with a device loadboard for placing the device under test (DUT). Typically, a test fixture is a detachably mechanical block and is composed, for example, of a ring shaped housing, a board, and a large number of pogo-pins. An active card 60 implementing the differential comparator of the present invention will be installed in a small space in the test fixture. Therefore, the differential comparators of the present invention can be incorporated in an existing semiconductor test system such as a one already used by a customer without changing the pin electronics or other hardware of the test system although minor changes may be needed in a test program.

In the example of FIG. 5, the active card 60 receives differential output signals from DUT 19 and provides comparison results to the logic comparator 17 (FIG. 1) through the pin electronics 20. The active card 60 receives control signals through the pin electronics produced based on the test program. The control signals controls setting of threshold voltages, supplying strobe signals, and supplying clock signals, and selecting the mode of operation in the differential comparator. In this arrangement, the drivers 15 in the pin electronics 20 for supplying the control signals to the active card 60 and the comparators 16 in the pin electronics 20 for receiving the comparison results from the active card 60 function as signal buffers rather than the original drivers or comparators.

Depending on the anticipated device to be tested, the active card 60 will include several to several tens of differential comparators. For example, suppose a semiconductor test system has 384 test pins, 4–8 differential comparators will be established in the active card 60 and about half of the test pins will be assigned to control the differential comparators and interfacing the inputs and outputs of the differential comparators. The active card 60 may also include differential drivers depending on types of semiconductor devices to be tested.

Figure 6:
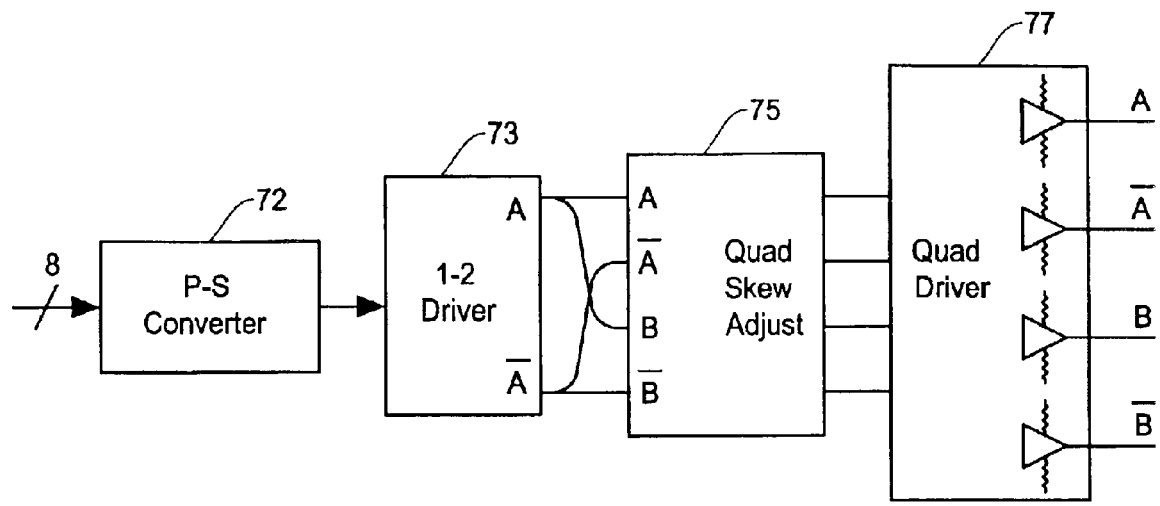
FIG. 6 is a schematic diagram showing an example of structure of a differential driver of the present invention to be used in combination with the differential comparator of the present invention.

An example of structure of a differential driver of the present invention is shown in a block diagram of FIG. 6. Typically, a differential driver is used in combination with the differential comparator of the present invention. A differential driver provides differential signals to a device under test as input stimulus. The example of FIG. 6 produces two pairs of differential outputs. The differential driver is comprised of a parallel-serial converter 72 for converting a parallel signal to a serial signal, a one-input two-output driver 73 for converting an input signal to complementary signals, a quad skew adjuster 75 for receiving the outputs of the driver 73 at two pairs of inputs and adjusting skews therebetween, and a quad driver 77 for producing two pairs of differential output signals through output buffers. Although not shown, to control the operation of the differential driver, control signals will be provided to the differential driver of FIG. 6 through the pin electronics 20.

Figure 7:
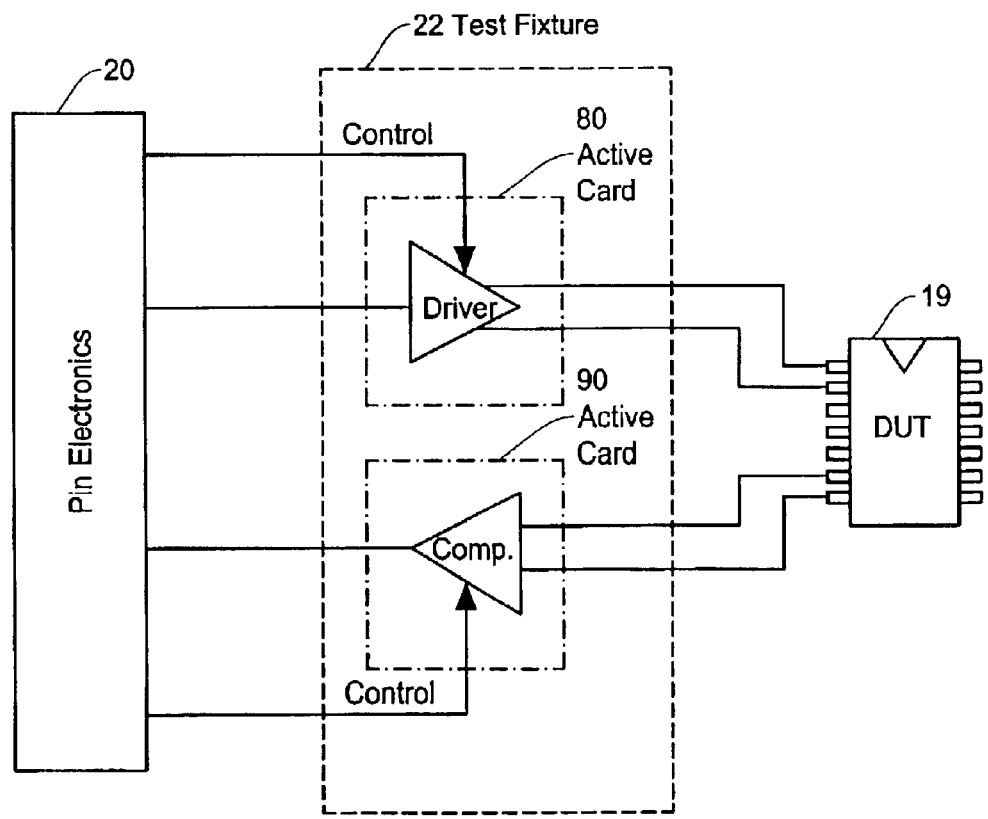
FIG. 7 is a schematic block diagram showing an active card implementing the differential driver and an active card implementing the differential comparator of the present invention where both active cards of the present invention are mounted in a test fixture of the semiconductor test system.

A schematic block diagram of FIG. 7 shows an active card 80 implementing the differential driver of FIG. 6 and an active card 90 implementing the differential comparator of FIG. 4. In this example, the active cards 80 and 90 are formed on separate substrates and installed in the test fixture 22. If a sufficient space is available in the test fixture 22, the differential drivers and differential comparators of the present invention will be formed on the same substrate.

Figure 8A:
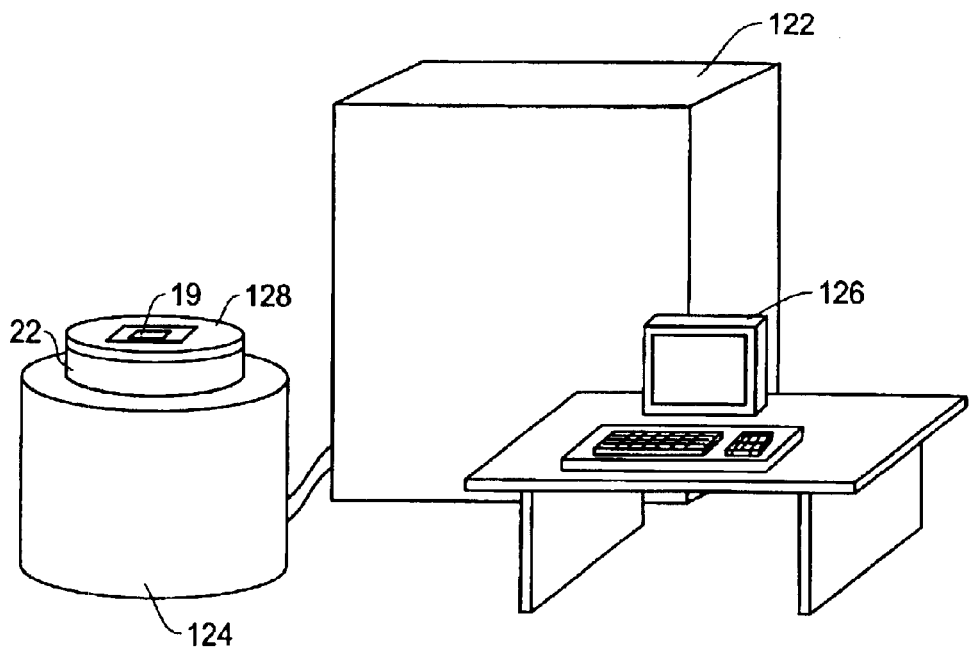
FIG. 8A is a perspective view showing an example of outer appearance of a semiconductor test system for mounting the differential comparator of the present invention and FIG. 8B is a schematic diagram showing a relationship among the DUT, test fixture and test head where the active card of the present invention is mounted in the test fixture.
Figure 8B:
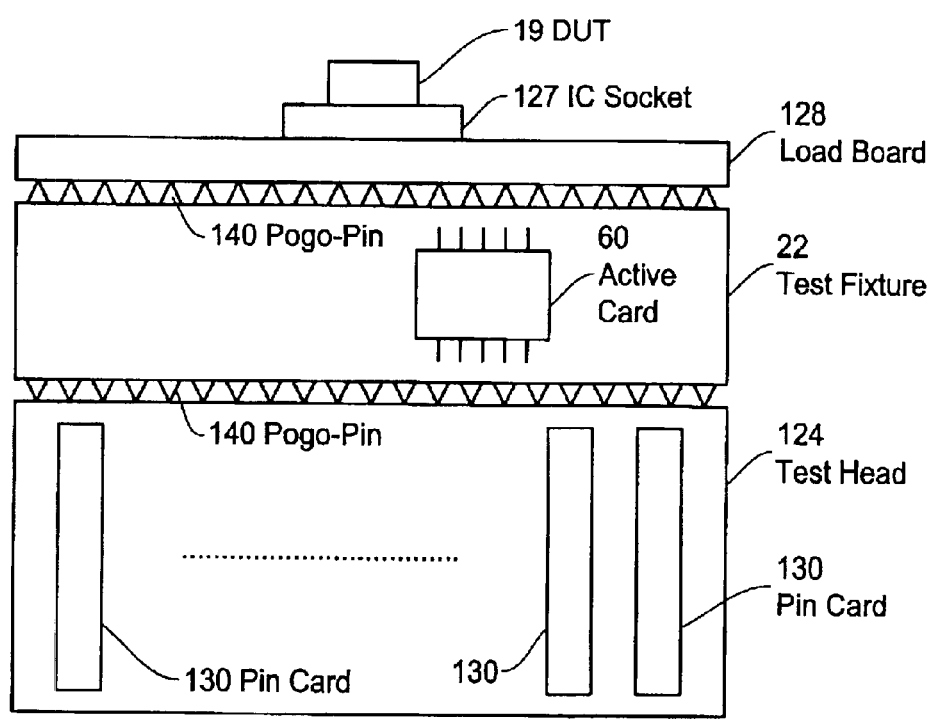

FIG. 8A is a perspective view showing an example of outer appearance of a semiconductor test system for mounting the differential comparator of the present invention. The semiconductor test system is basically formed with a main frame 122, a test head 124, and a work station 126. FIG. 8B is a schematic diagram showing a more detailed structure of the test head of the semiconductor test system of FIG. 8A. The structure of FIG. 8B shows a relationship among the DUT, test fixture and test head where the active card of the present invention is mounted in the test fixture.

In FIG. 8A, the work station 126 is a computer provided with, for example, a graphic user interface (GUI) to function as an interface between the test system and a user. Operations of the test system, creation of test programs, and execution of the test programs are conducted through the work station 126. The main frame 122 includes a large number of test channels each having the test processor 11, pattern generator 12, timing generator 13, wave formatter 14 and logic comparator 17 shown in FIG. 1.

Figure 1:
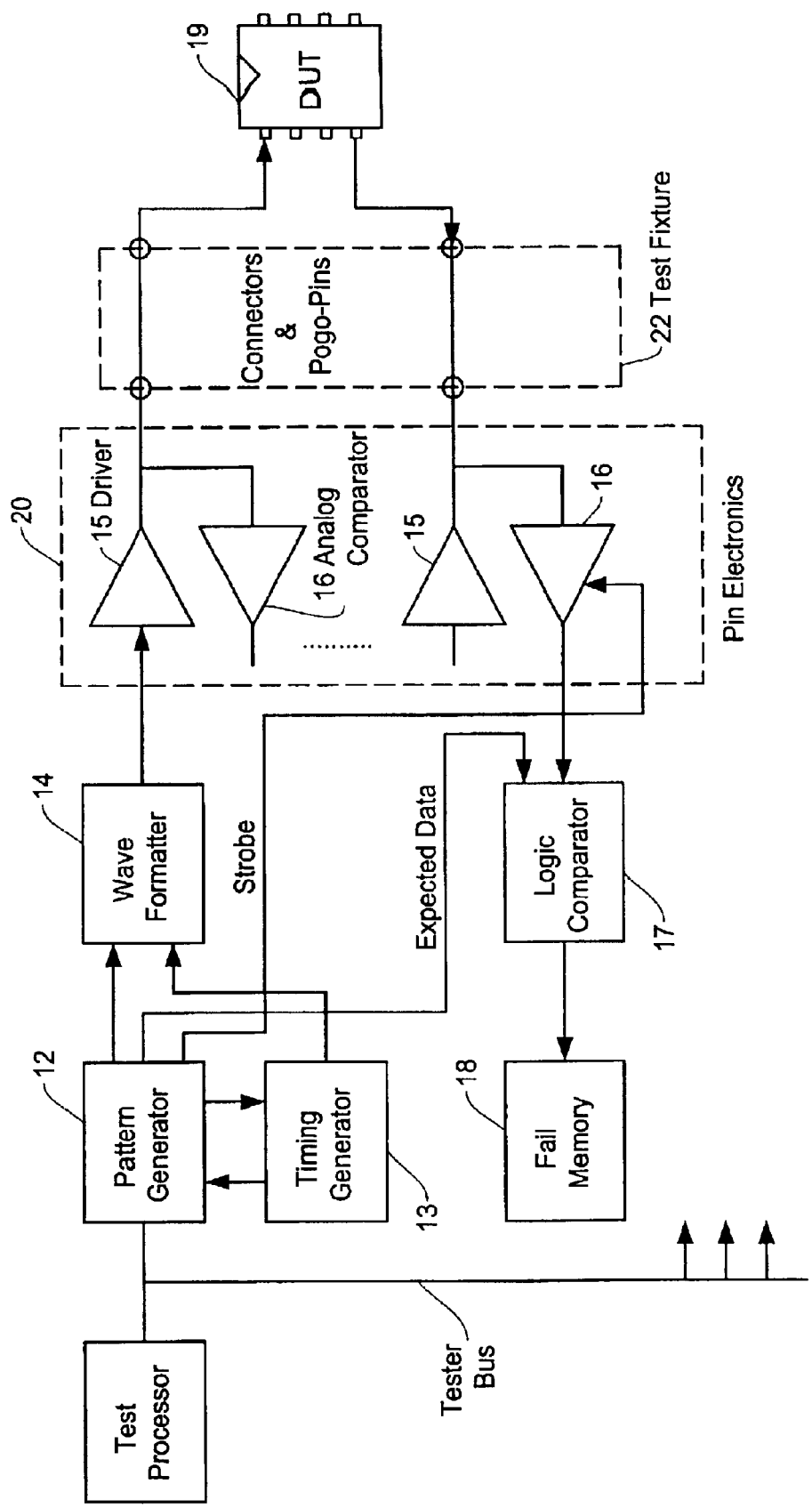
FIG. 1 is a block diagram showing an example of basic configuration of a semiconductor test system for testing semiconductor devices where the differential comparator circuit of the present invention can be incorporated.
Figure 2A:
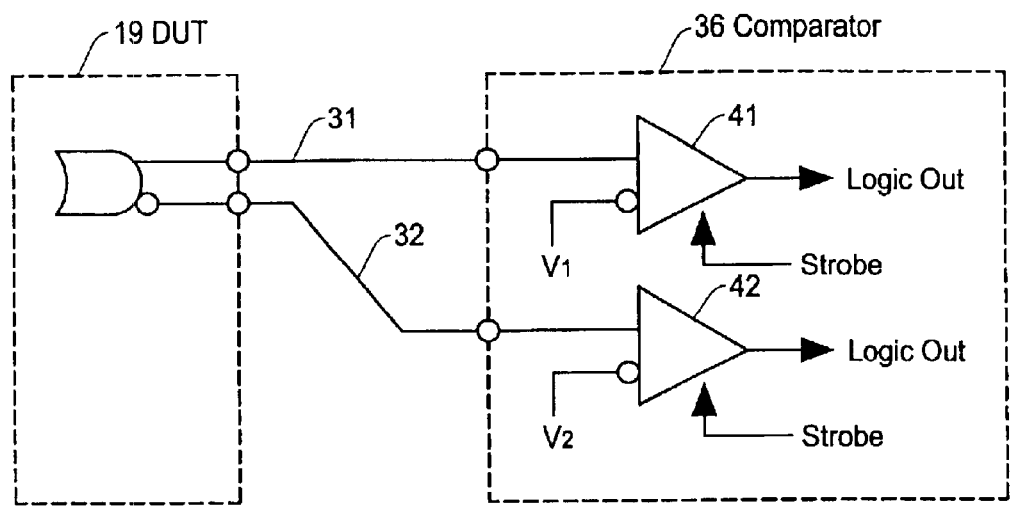
FIG. 2A is a circuit diagram showing an example of differential comparator circuit in the conventional technology.
Figure 2B:
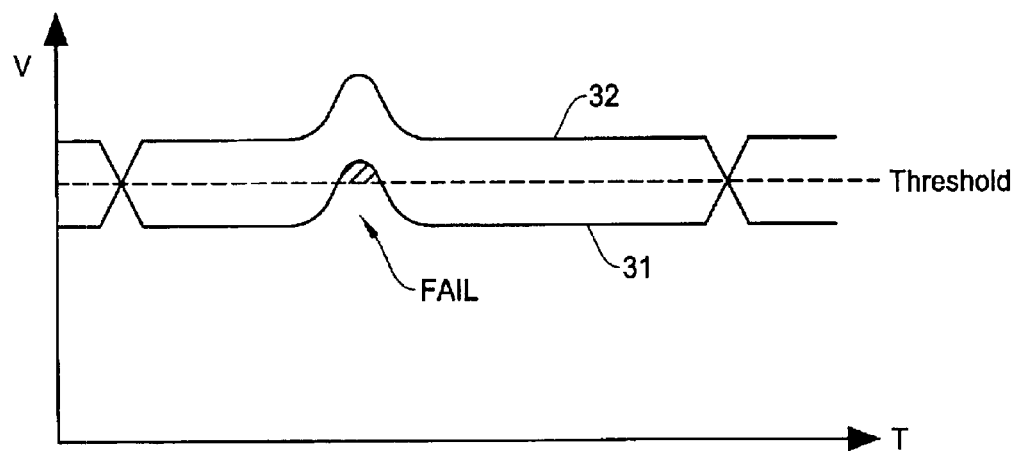
FIG. 2B is a waveform diagram for explaining a problem involved in the differential comparator circuit of FIG. 2A.

The test head 124 includes a large number of printed circuit boards each having the pin electronics 20 shown in FIG. 1. The drivers 15, analog comparators 16 (FIGS. 1 and 5) and switches (not shown) for switching the pins of the device under test are provided in the pin electronics 20. The test head 124 has, for example, a cylindrical shape in which the printed circuit boards (pin cards 130) including the pin electronics 20 are radially aligned. On an upper surface of the test head 124, a device under test 19 is inserted in an IC socket (test socket) 127 at about the center of a performance board (loadboard) 128.

Between the pin electronics 20 and the loadboard (performance board) 28, there is provided with a test (pin) fixture 22 shown in FIG. 1 which is a contact mechanism for transmitting electrical signals therethrough. The pin fixture 22 includes a large number of contactors such as pogo-pins 140 for electrically connecting the pin electronics 20 and the performance board 128. As noted above, the device under test 19 receives a test pattern from the pin electronics and produces a response output signal which is evaluated by the semiconductor test system.

In FIG. 8B, the active card 60 having at least the differential comparator (FIGS. 4A and 4B) or both the differential comparator and the differential driver (FIG. 6) is mounted in the test fixture 22. Typically, the test fixture 22 includes a large number of pogo-pins 140 to establish the contact mechanism to electrically connect the test head 124 to the loadboard 128. Since the active card 60 is very small, such as one square inches, it can be mounted on a space found in the test fixture 22. The test head 124 includes a large number of pin cards 130 each including the pin electronics 20.

According to the present invention, the differential comparator circuit can be easily installed in a semiconductor test system existing in the market at low cost. The differential comparator circuit is formed with discrete semiconductor components, rather than an IC chip, thus, can be produced without an expensive semiconductor design and production process. Further, the differential comparator circuit is designed to detect a short term change in the common mode voltage while not being affected by the common mode voltage change.

In the present invention, an active card having at least a differential comparator circuit is created and is mounted in a test fixture of the semiconductor test system. The active card having the differential comparator circuit provides comparison results to a pin electronics of a semiconductor test system and receives control signals from the pin electronics. Since the test fixture is detachably from a test head of the semiconductor test system, the active card can be easily installed in the semiconductor test system without significantly affecting the preexisting performance of the test system.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A comparator circuit for a semiconductor test system for differential signals that are output from a device under test (DUT), comprising:
   a first pair of comparators having a DC comparator and an AC comparator which receives a first differential signal from the DUT;
   a second pair of comparators having a DC comparator and an AC comparator which receives a second differential signal from the DUT;
   a first latch circuit for latching output signals of the first pair of comparators at timings specified by strobe signals;
   a second latch circuit for latching output signals of the second pair of comparators at timings specified by strobe signals;
   a first serial-parallel converter for converting an output signal of the first latch circuit into a parallel signal; and
   a second serial-parallel converter for converting an output signal of the second latch circuit into a parallel signal;
   wherein the comparator circuit is formed of discrete components on a dielectric substrate.

2. A comparator circuit as defined in claim 1, wherein the DC comparator in the first pair of comparators is directly provided with the first differential signal while the AC comparator in the first pair of comparators is provided with the first differential signal through a capacitor, and the DC comparator in the second pair of comparators is directly provided with the second differential signal while the AC comparator in the second pair of comparators is provided with the second differential signal through a capacitor.

3. A comparator circuit as defined in claim 1, wherein each of the DC comparators in the first and second pairs of comparators is provided with a threshold voltage for comparing the differential signal from the DUT with the threshold voltage, and each of the AC comparators in the first and second pairs of comparators is provided with a threshold voltage for comparing the differential signal for the DUT with the threshold voltage.

4. A comparator circuit as defined in claim 1, wherein the strobe signals for the first latch circuit and the second latch circuit are produced by the semiconductor test system and provided to the comparator circuit through a pin electronics of the semiconductor test system where the pin electronics includes a plurality of drivers and comparators designed for testing non-differential output devices.

5. A comparator circuit as defined in claim 4, further including means for receiving a control signal through the pin electronics of the semiconductor test system for controlling an operation of the comparator circuit.

6. An active card for a semiconductor test system for testing a semiconductor device under test (DUT) comprising:
   a differential comparator circuit for comparing differential signals that are output from the DUT, comprising:
      a first pair of comparators having a DC comparator and an AC comparator which receives a first differential signal from the DUT;
      a second pair of comparators having a DC comparator and an AC comparator which receives a second differential signal from the DUT;
      a first latch circuit for latching output signals of the first pair of comparators at timings specified by strobe signals;
      a second latch circuit for latching output signals of the second pair of comparators at timings specified by strobe signals;
      a first serial-parallel converter for converting an output signal of the first latch circuit into a parallel signal; and
      a second serial-parallel converter for converting an output signal of the second latch circuit into a parallel signal;
   a dielectric substrate for mounting discrete components on a surface thereof for establishing the differential comparator circuit;
   wherein the active card having the differential comparator circuit is mounted in a test fixture of the semiconductor test system where the test fixture is located between the DUT and a pin electronics of the semiconductor test system for establishing electrical connection therebetween.

7. An active card as defined in claim 6, further comprising a differential driver for generating differential output signals as input stimulus of a semiconductor device under test.

8. An active card as defined in claim 7, wherein the differential driver receives a parallel signal from the semiconductor test system and converts the parallel signal to a serial signal in a form of differential signals.

9. An active card as defined in claim 6, wherein the DC comparator in the first pair of comparators is directly provided with the first differential signal while the AC comparator in the first pair of comparators is provided with the first differential signal through a capacitor, and the DC comparator in the second pair of comparators is directly provided with the second differential signal while the AC comparator in the second pair of comparators is provided with the second differential signal through a capacitor.

10. An active card as defined in claim 6, wherein each of the DC comparators in the first and second pairs of comparators is provided with a threshold voltage for comparing the differential signal from the DUT with the threshold voltage, and each of the AC comparators in the first and second pairs of comparators is provided with a threshold voltage for comparing the differential signal for the DUT with the threshold voltage.

11. An active card as defined in claim 6, wherein the strobe signals for the first latch circuit and the second latch circuit are produced by the semiconductor test system and provided to the differential comparator circuit through a pin electronics of the semiconductor test system where the pin electronics includes a plurality of drivers and comparators designed for testing non-differential output devices.

12. An active card as defined in claim 11, further including means for receiving a control signal through the pin electronics of the semiconductor test system for controlling an operation of the differential comparator circuit.

* * * * *